United States Patent
Kawashima et al.

(10) Patent No.: US 7,026,078 B2
(45) Date of Patent: Apr. 11, 2006

(54) METHOD OF MANUFACTURING PHOTOMASK

(75) Inventors: Hiroshi Kawashima, Tokyo (JP); Yoshitaka Yamada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 169 days.

(21) Appl. No.: 10/635,510

(22) Filed: Aug. 7, 2003

(65) Prior Publication Data

US 2004/0180268 A1 Sep. 16, 2004

(30) Foreign Application Priority Data

Mar. 14, 2003 (JP) .............................. 2003-069693

(51) Int. Cl.
*G03F 1/00* (2006.01)
*G03F 1/08* (2006.01)
*G06F 17/50* (2006.01)
*G06K 9/03* (2006.01)

(52) U.S. Cl. .............................. 430/5; 716/19; 716/20; 382/144

(58) Field of Classification Search .................... 430/5; 716/19, 20; 382/141, 144, 145, 149
See application file for complete search history.

(56) References Cited

U.S. PATENT DOCUMENTS

| | | | | |
|---|---|---|---|---|
| 5,948,573 A | * | 9/1999 | Takahashi | 430/5 |
| 6,137,901 A | * | 10/2000 | Harazaki | 382/144 |
| 6,335,981 B1 | | 1/2002 | Harazaki | |
| 2002/0142233 A1 | * | 10/2002 | Inoue | 430/5 |
| 2003/0096177 A1 | * | 5/2003 | Iwasaki | 430/5 |

* cited by examiner

*Primary Examiner*—Mark F. Huff
*Assistant Examiner*—John Ruggles
(74) *Attorney, Agent, or Firm*—Oblon, Spivak, McClelland, Maier & Neustadt, P.C.

(57) ABSTRACT

First, a correction is made for correcting the mask pattern configuration of a photomask (3) used for exposure in accordance with the space between a mask pattern and an adjacent mask pattern thereto and a desired configuration to be transferred from the mask pattern. Second, a correction is made for dividing the photomask (3) into a plurality of mesh regions (M) to correct the pattern configuration of the photomask (3) in accordance with the occupation rate (R) of the mask pattern in each of the mesh regions (M).

18 Claims, 6 Drawing Sheets

| R \ S | S<S11 | S>S12 | — |
|---|---|---|---|
| 0≦R<10 | +L11 | −L12 | — |
| R \ S | S<S21 | S>S22 | — |
| 10≦R<20 | +L21 | −L22 | — |
| R \ S | S<S31 | S>S32 | — |
| 20≦R<40 | +L31 | −L32 | — |
| R \ S | S<S41 | S>S42 | S>S43 |
| 40≦R | +L41 | −L42 | −L43 |

FIG. 7

| $0 \leqq R < 10$ | LL11 |
| --- | --- |
| $10 \leqq R < 20$ | LL21 |
| $20 \leqq R < 40$ | LL31 |
| $40 \leqq R$ | LL41 |

FIG. 8

| 1 | 1 | 1 | 1 | 1 | 1 |
| --- | --- | --- | --- | --- | --- |
| 1 | 1 | 1 | 1 | 1 | 1 |
| 1.1 | 1 | 1 | 1 | 1 | 1 |
| 1.1 | 1 | 1 | 1 | 1 | 1 |
| 1.1 | 1.2 | 1 | 1.1 | 1.1 | 1.1 |
| 1 | 1 | 1 | 1 | 1.1 | 1 |

FIG. 9

|   |   |   |
|---|---|---|
| 1 | 1 | 1 |
| 1 | 1 | 1 |
| 1.1 | 1 | 1.1 | m22 { 1.1
MM11  m21

FIG. 10

| 1 | 1 | 1 | 1 | 1 | 1 |
|---|---|---|---|---|---|
| 1 | 1 | 1 | 1 | 1 | 1 |
| 1.1 | 1 | 1 | 1 | 1 | 1 |
| 1.1 | 1 | 1 | 1 | 1 | 1 |
| 1.2 | 1.3 | 1 | 1.1 | 1.2 | 1.2 |
| 1.1 | 1.1 | 1 | 1 | 1.2 | 1.1 |

METHOD OF MANUFACTURING PHOTOMASK

BACKGROUND OF THE INVENTION

1. Field of the Invention

The present invention relates to a method of manufacturing a photomask, and more particularly, to a method of manufacturing a photomask by which the photomask is corrected for minimizing manufacturing variations caused by the mask pattern density.

2. Description of the Background Art

With the recent miniaturization and higher integration of semiconductor devices, a pattern transferred to a substrate (hereinafter also referred to as a transferred pattern) using a photomask has dimensions substantially the same as or less than the wavelength of exposure light, raising the problem of optical proximity effect. This optical proximity effect is the interference effect of a light radiation energy caused by a mask pattern itself or an adjacent mask pattern thereto at the time of exposure. This optical proximity effect causes a transferred pattern to be shifted from a photomask pattern. That is, this effect causes degraded size controllability in a photolithography process. Conventionally, optical proximity correction has been performed on photomasks for improving the size controllability in the photolithography process. The optical proximity correction is a method of correcting the configuration of a mask pattern of a photomask by previously taking into consideration the shift of a transferred pattern from a photomask pattern caused by the optical proximity effect.

Another correction method is to provide a dummy pattern for reducing a difference in density between patterns. Still another correction method is disclosed in Japanese Patent Application Laid-Open No. 10-326010 (1998) (Document 1) (pp. 5–12, FIGS. 1–12). Document 1 describes that pattern data of a plurality of photomasks is received at once, and the entire region of each photomask is subjected to a correction for the optical proximity effect in a photoresist. More specifically, an underlayer correction region is automatically extracted from the entire region of each photomask for making the optical proximity correction resulting from a base structure and material of the photoresist.

Such optical proximity correction, however, only corrects the mask pattern configuration of a photomask with regard to the optical proximity effect appearing in the range of the order of several micrometers. Thus, the conventional optical proximity correction does not correct the shift of a finished pattern after transfer and etching from a photomask pattern caused by the pattern density in the range of the order of several tens micrometers or greater. Correcting the shift of a transferred pattern from a photomask pattern caused by the pattern density in the range of the order of several tens micrometers or greater is hereinafter also referred to as pattern-density-induced correction.

Further, the correction of mask pattern configuration disclosed in Document 1 is directed to the optical proximity effect resulting from the base structure and material of the photoresist, but it is not directed to the shift of a transferred pattern from a photomask pattern caused by the pattern density in the range of the order of several tens micrometers or greater.

SUMMARY OF THE INVENTION

It is an object of the present invention to provide a method of manufacturing a photomask capable of making a correction for the pattern density in a greater range as well as a correction for the optical proximity effect appearing in the range of the order of several micrometers.

According to one embodiment of the present invention, the method of correcting a photomask includes: calculating a first correction for correcting a configuration of a mask pattern of the photomask in accordance with; (i) a space between the mask pattern and an adjacent mask pattern thereto, and (ii) a desired configuration to be transferred from the mask pattern; dividing the photomask into a plurality of regions; calculating a second correction correcting a configuration of a pattern of the photomask in accordance with an occupation rate of the mask pattern in each of the plurality of regions; and correcting said photomask based on said first correction and said second correction.

The correction resulting from the pattern density in a greater range may be made as well as the correction for the optical proximity effect appearing in the range of the order of several micrometers. Thus, a semiconductor device can be manufactured with higher dimensional accuracy.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a correction table according to a second preferred embodiment of the invention;

FIGS. 8 to 10 are plan views each showing a photomask according to a third preferred embodiment of the invention.

DESCRIPTION OF THE PREFERRED EMBODIMENTS

Hereinafter, the present invention will be specifically described in reference to the accompanying drawings.

First Preferred Embodiment

Figure 1:
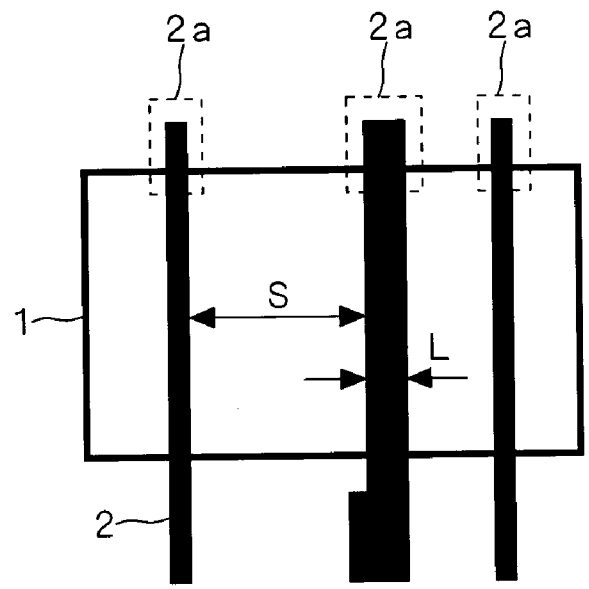
FIG. 1 is a plan view showing a semiconductor device according to a first preferred embodiment of the present invention.
Figure 2:
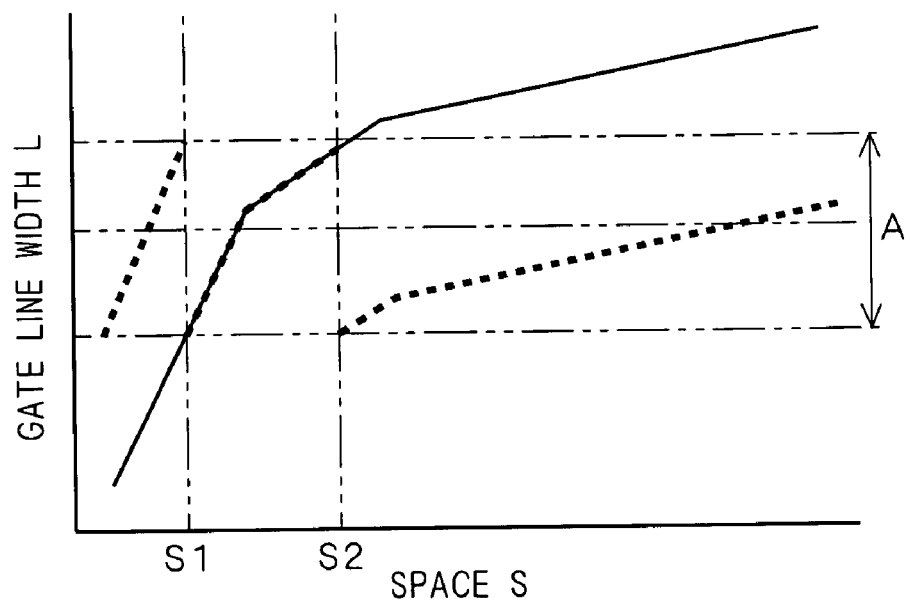
FIG. 2 is a graph plotting finished gate width against space in the first preferred embodiment.

FIG. 1 is a plan view showing a semiconductor device according to a first preferred embodiment of the invention. As shown, a plurality of gate interconnects 2 are formed on a semiconductor device 1. The gate width of a gate interconnect 2 shall be designated as L, and the space between two gate interconnects 2 shall be designated as S. FIG. 2 is a graph plotting finished gate width L against space S. FIG. 2 illustrates by a solid line the gate width L of a gate formed on a substrate in relation to the space S, in which a desired gate width L including manufacturing errors falls within a range indicated by A. Although the gate interconnects 2 are inherently required to be formed with the gate width L falling within the range of A, the optical proximity effect causes the gate width L to be reduced when the space S is narrower than S1.

On the other hand, when the space S is wider than S2, the optical proximity effect causes the gate width L to be increased. Thus, the optical proximity correction is made on the mask pattern configuration of a photomask. Specifically, when the space S is narrower than S1, the mask pattern configuration of the photomask is increased by correction such that the gate width L plotted by the solid line in FIG. 2 becomes the gate width L plotted by broken lines. On the contrary, when the space S is wider than S2, the mask pattern configuration of the photomask is reduced by correction such that the gate width L plotted by the solid line in FIG. 2 becomes the gate width L plotted by broken lines. Although the present embodiment has described the optical proximity correction, the present invention is not limited thereto, but may be directed to a correction of the mask pattern configuration in accordance with the space between the mask pattern and an adjacent mask pattern thereto and a desired configuration to be transferred from the mask pattern.

Figure 3:
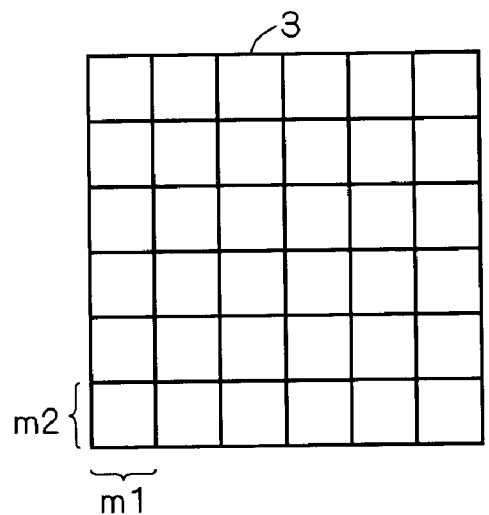
FIG. 3 is a plan view showing a photomask according to the first preferred embodiment.

Now, the present embodiment will be described with respect to a photomask of a semiconductor device. FIG. 3 shows a photomask 3 according to the present embodiment. The photomask 3 is divided into m1×m2 regions, e.g., 100 μm×100 μm regions. Regions obtained by division will hereinafter also be called mesh regions M. That is, the photomask 3 is divided into m1×m2 mesh regions M. The occupation rate R of a mask pattern is calculated for each mesh region M. In the present embodiment, the occupation rate R is described as the occupation rate of a gate pattern. However, the mask pattern according to the present invention is not limited to a gate pattern. Here, the occupation rate R of the gate pattern represents a value obtained by dividing the area of a gate interconnect 2 in a mesh region M by the area of the mesh region M. For instance, when a gate interconnect 2 occupies an area of 500 μm² in a 100 μm×100 μm mesh region M, the occupation rate R is calculated as 500/10000=5%.

Figure 4:
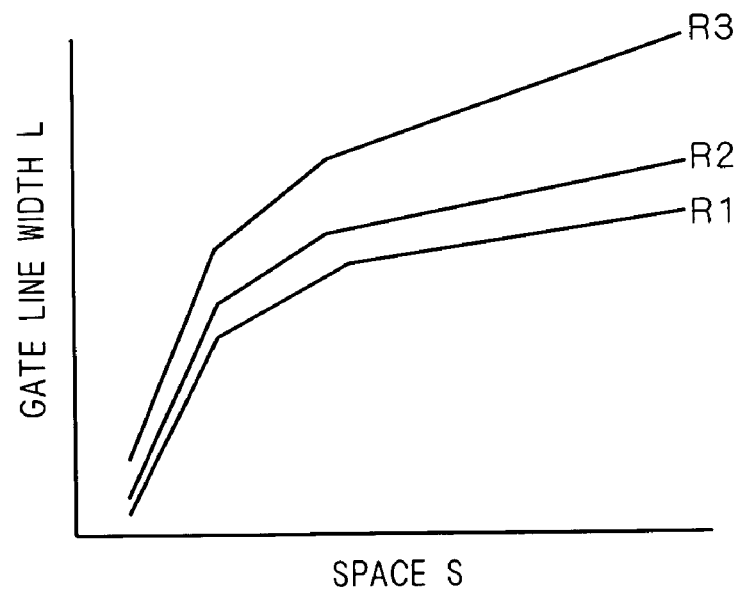
FIG. 4 is a graph plotting finished gate width against space depending on the occupation rate in the first preferred embodiment.

The difference in occupation rate between gate patterns causes variations in the finished gate width L with respect to a photomask pattern. That is, a high occupation rate R means patterns are densely formed, causing a transferred pattern to be greatly shifted from a pattern of the photomask 3 under influences of adjacent patterns. FIG. 4 is a graph plotting finished gate width L against space S. The graph of FIG. 4 contains the shift of a finished pattern after transfer and etching from a pattern of the photomask 3 caused by the pattern density in the range of the order of several tens micrometers or greater as well as the shift of a transferred pattern from a pattern of the photomask 3 caused by the optical proximity effect shown in FIG. 2. For instance, as the occupation rate R increases from R1 to R3, the gate width L increases in all the spaces S.

Figures 5, 6:
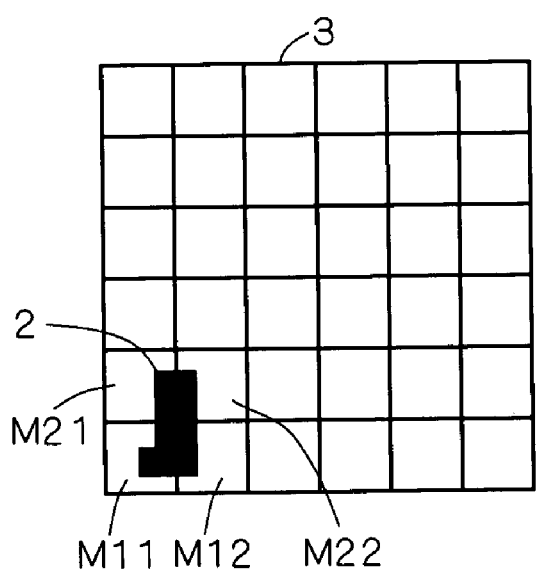
FIG. 5 is a correction table according to the first preferred embodiment.
FIG. 6 is a plan view showing the photomask according to the first preferred embodiment.

FIG. 5 is a correction table according to the present embodiment. In the present embodiment, the correction based on the space S (the optical proximity correction) as described above and the correction based on the occupation rate R (the pattern-density-induced correction) are combined together to generate the correction table as shown in FIG. 5. The range where the correction based on the space S has an effect is smaller than that where the correction based on the occupation rate R has an effect. The correction table can be obtained through experiments or simulations. Based on the correction table, the mask pattern configuration of the photomask 3 is corrected to form a gate interconnect 2 having a desired gate width L. For instance, when the occupation rate R in a mesh region M is 8% and the space S is narrower than S11, the amount of correction is +L11. The mask pattern configuration of the photomask 3 in the mesh region M is corrected by this amount of correction. When the occupation rate R in another mesh region M is 45% and the space S is wider than S43, the amount of correction is −L43.

In the case where the pattern of a gate interconnect 2 occupies four mesh regions M as shown in FIG. 6, the amount of correction may be determined simply from the occupation rate R of each of the mesh regions M. However, in an alternative embodiment, the amount of correction of the respective mesh regions M may be averaged to determine the amount of correction of each of the mesh regions M. Specifically, the amount of correction for each of mesh regions M11, M12, M21 and M22 shown in FIG. 6 is first obtained from the correction table. The obtained amounts of correction are averaged to determine the amount of correction for each of the mesh regions M11, M12, M21 and M22, thereby correcting the mask pattern configuration of the photomask 3.

The method of correcting the photomask according to the present embodiment as described includes calculating a first correction for correcting the configuration (or dimensions) to be transferred from a mask pattern in accordance with: (i) the space between the mask pattern and an adjacent mask pattern thereto, and (ii) a desired configuration (or dimensions) of the mask pattern; dividing the mask pattern into a plurality of regions; calculating a second correction for correcting the pattern configuration of the photomask in accordance with the occupation rate of a mask pattern in each of the plurality of regions; and correcting said photomask based on said first correction and said second correction. This enables not only correction of the optical proximity effect appearing in the range of the order of several micrometers, but also the pattern-density-induced correction in a greater range may be made. Thus, a semiconductor device can be manufactured with higher dimensional accuracy.

Furthermore, according to the method of the present embodiment, the correction is made based on the correction table generated in accordance with the occupation rate, allowing a photomask 3 of various patterns to be corrected rapidly. Thus, photomask manufacture can be performed efficiently.

Furthermore, according to the method of the present embodiment, the correction is made based on the correction table generated in accordance with the occupation rate, allowing the photomask 3 of various patterns to be corrected rapidly. Thus, photomask manufacture can be performed effectively.

Still further, when a mask pattern occupies a plurality of regions, the amount of correction of the mask pattern in each respective region is the average of the amount of correction of the mask pattern in each respective region occupied by the mask pattern. Thus, the method of the present embodiment can correct influences exerted by the mask pattern in adjacent regions, allowing the mask pattern configuration of the photomask 3 to be corrected more precisely.

In addition to the corrections described in the present embodiment, open ends as shown in FIG. 1 by the numeral 2a may be corrected by the amount of correction in accordance with the occupation rate R of a mesh region M. The correction for the open ends may be made either before or after the corrections described in the present embodiment.

Addition of this correction allows a semiconductor device to be manufactured with still higher dimensional accuracy.

Second Preferred Embodiment

The present embodiment will also be described taking the size of a photomask as that of a repeating unit of a semiconductor device. As shown in FIG. 3, the photomask 3 is divided into m1×m2 mesh regions M, e.g., 100 μm×100 μm mesh regions M. The occupation rate R of a mask pattern is calculated for each of the mesh regions M. In the present embodiment, description will also be made on the occupation rate R of a gate pattern.

Figures 7, 8:
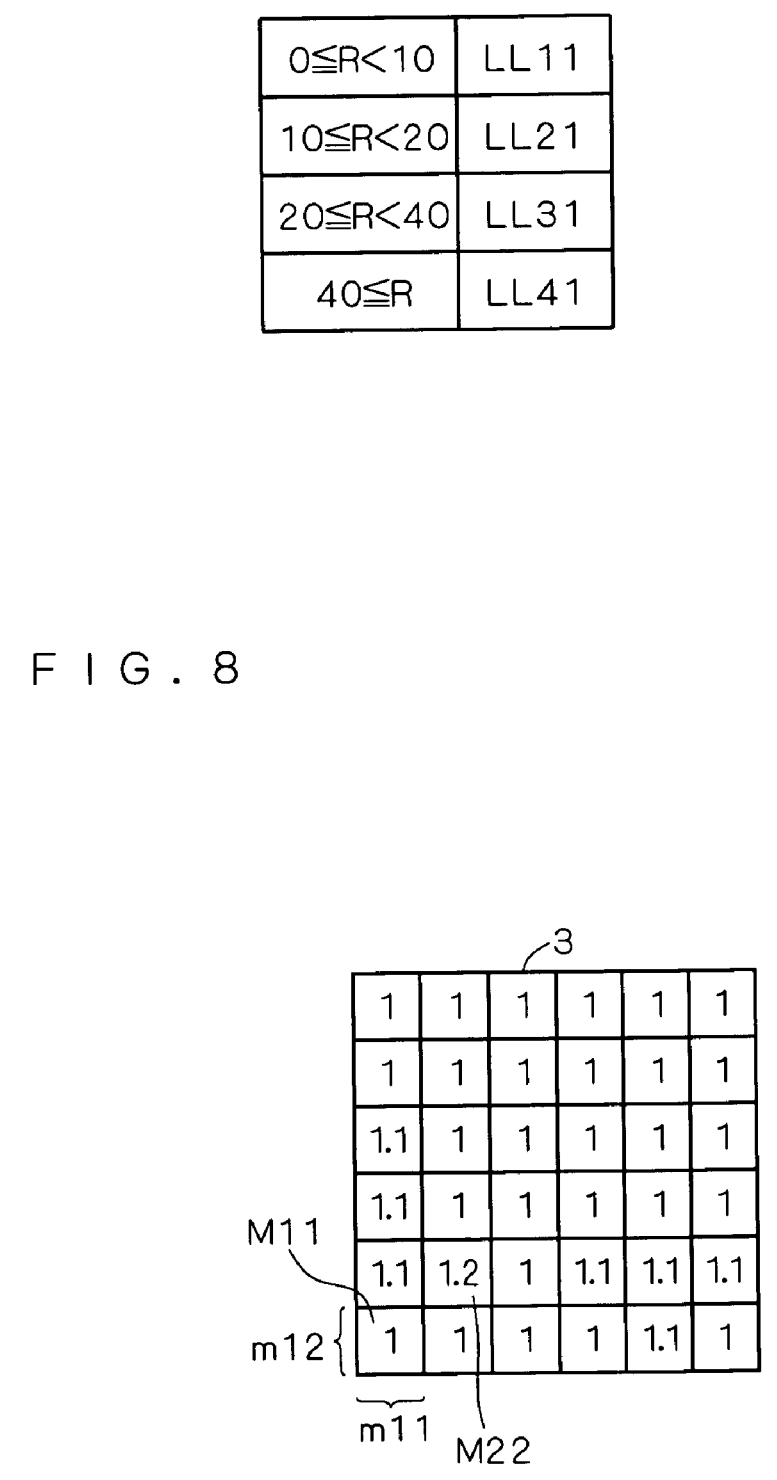

In the present embodiment, the mask pattern configuration of the photomask 3 is corrected based on the difference in occupation rate R between gate patterns. Thus, the shift of the gate width L with respect to a photomask pattern caused by the pattern density can be corrected. In the present embodiment, a correction table as shown in FIG. 7 is provided such that the amount of correction can be derived from the occupation rate R. Such correction table is obtained through experiments or simulations. For instance, when the occupation rate R of a mesh region M is 12%, the amount of correction is LL21, and when the occupation rate R of the mesh region M is 52%, the amount of correction is LL41.

In the present embodiment as well, in the case where the pattern of a gate interconnect 2 is occupied by four mesh regions M as shown in FIG. 6, the amount of correction for each of the mesh regions M11, M12, M21 and M22 is first obtained from the correction table. The obtained amounts of correction are averaged to determine the amount of correction for each of the mesh regions M11, M12, M21 and M22 based on the average value, thereby correcting the mask pattern configuration of the photomask 3.

The correction table of the present embodiment is similar to that described in the first preferred embodiment. However, the correction table of the first preferred embodiment indicates the amount of correction combining the amount of correction caused by the pattern density and that caused by the optical proximity effect. That is, the amount of correction is varied relying upon the space S in the first preferred embodiment, whereas the correction table of the present embodiment only indicates the amount of the pattern-density-induced correction. Thus, the present embodiment requires the optical proximity correction to be performed separately.

The optical proximity correction is a method of correcting the shift of the gate width L with respect to a pattern of the photomask 3 caused by influences exerted by a mask pattern itself or an adjacent mask pattern thereto. This correction method is the same as the optical proximity correction which has conventionally been employed, a detailed explanation of which will be omitted here. The relationship between the space S and gate width L is estimated as plotted by the solid line as shown in, for example, FIG. 2 in the first preferred embodiment. When the space S is narrower than S1, the gate width L is formed small. Then, the mask pattern configuration of the photomask 3 is corrected to increase the gate width L. When the space S is wider than S2, the gate width L is formed large. Then, the mask pattern configuration of the photomask 3 is corrected to reduce the gate width L.

As described, according to the method of the present embodiment, the optical proximity correction and the pattern-density-induced correction are made independently to correct the mask pattern configuration of the photomask 3. Thus, when a change in any of the process variables requires a modification of the amount of correction, the amount of either the optical proximity correction or pattern-density-induced correction that requires modification may be independently recalculated and modified. This allows changing process variables to be simplified.

Although the present embodiment has described that the optical proximity correction is made after the pattern-density-induced correction, the present invention is not limited thereto. The pattern-density-induced correction may be made after the optical proximity correction. Further, as in the first preferred embodiment, the optical proximity correction and pattern-density-induced correction are made, allowing a semiconductor device to be manufactured with higher dimensional accuracy.

Third Preferred Embodiment

The present embodiment will also be described taking the size of a photomask as that of a repeating unit of a semiconductor device. FIG. 8 illustrates the photomask 3 divided into m11×m12 mesh regions M. An m11×m12 mesh region M is a region that is affected by factors causing a shift of a finished pattern due to the pattern density in an etching step of a semiconductor device. For instance, the m11×m12 mesh region M is of 100 μm×100 μm size, which is a range where the finished pattern is shifted due to the pattern density when etching polysilicon which serves as the gate interconnects 2. Variations in material, process and the like cause variations in a range where the finished pattern is shifted due to the pattern density which is a correction factor. This requires an optimum size to be selected for a mesh region M for each correction factor.

The occupation rate R of a mask pattern is calculated for each of m11×m12 mesh regions M. In the present embodiment, description will also be made on the occupation rate R of a gate pattern. The amount of the pattern-density-induced correction is calculated from the obtained occupation rate R using a correction function. In the mesh regions M shown in FIG. 8, the numbers each represent the amount of correction added to 1. Here, the correction function is a function using the occupation rate R as a variable, and is obtained through experiments or simulations. The correction table as described in the first and second preferred embodiments may be adopted instead of the correction function. Conversely, the correction function may be adopted instead of the correction table in the first and second preferred embodiments.

Next, FIG. 9 illustrates the photomask 3 divided into m21×m22 mesh regions M. An m21×m22 mesh region M is a region that is affected by factors causing a shift of a finished pattern due to the pattern density in an etching step of the photomask 3. For instance, the m21×m22 mesh region M is of 200 μm×200 μm size, which is a range where the finished pattern is shifted due to the pattern density when etching chromium, which serves as a light shielding film for the photomask 3. Variations in material and other process variables cause variations in a range where the finished pattern is shifted due to the pattern density, which is a correction factor. This requires an optimum size to be selected for a mesh region M for each correction factor.

The occupation rate R of a gate pattern is calculated for each of the m21×m22 mesh regions M. The amount of the pattern-density-induced correction is calculated from the obtained occupation rate R using a correction function. In the mesh regions M shown in FIG. 9, the numbers each represent the amount of correction added to 1. Here, the correction function is a function using the occupation rate R as a variable, and is obtained through experiments or simulations. The corrections shown in FIGS. 8 and 9 differ from each other in the amount of shift of the finished pattern caused by the pattern density, resulting in different sizes of mesh region M and different correction functions from each other.

In the present embodiment, the amount of correction in FIG. 8 and that of FIG. 9 are added together to obtain the amount of pattern-density-induced correction. FIG. 10 illustrates the photomask 3 divided into m11×m12 mesh regions M. The amount of correction in the mesh region M11 shown in FIG. 10 is obtained as 0.1 by adding the amount of correction "0" in the mesh region M11 shown in FIG. 8 and the amount of correction "0.1" in a mesh region MM11 shown in FIG. 9. Likewise, the amount of correction in the mesh region M22 shown in FIG. 10 is obtained as 0.3 by adding the amount of correction "0.2" in the mesh region M22 shown in FIG. 8 and the amount of correction "0.1" in the mesh region MM11 shown in FIG. 9. In FIG. 10, the numbers each represent the amount of correction added to 1. Although the size of a mesh region M varies depending on factors, the final correction is made on the basis of a mesh region M of the minimum size.

In the present embodiment, a plurality of corrections are made for each factor (hereinafter also referred to as a correction factor) that causes the shift of a transferred pattern due to the pattern density. That is, the amount of the pattern-density-induced correction is independently calculated for each different correction factor, and resulting amounts of correction are added together, thereby generally making the pattern-density-induced correction. The above description has been directed to the pattern-density-induced correction based on the two different correction factors. In the present invention, however, the number of different correction factors is not limited to two, but three or more different correction factors may exist. The amount of the pattern-density-induced correction is generalized to derive the following equation: the amount of correction=$f_1(R)+f_2(R)+f_3(R)+\ldots$, where $f_1(R)$, $f_2(R)$ and $f_3(R)$ are correction functions each using the occupation rate R as a variable, which vary depending on correction factors.

The pattern-density-induced correction and optical proximity correction are made independently in the present embodiment as well. Thus, the present embodiment also requires the optical proximity correction to be made in addition to the above-described correction. In the optical proximity correction as shown in FIG. 2 of the first preferred embodiment, since the gate width L is formed small when the space S is narrower than S1, the mask pattern configuration of the photomask 3 is corrected to increase the gate width L. Since the gate width L is formed large when the space S is wider than S2, the mask pattern configuration of the photomask 3 is corrected to reduce the gate width L.

As described, the method of manufacturing the photomask according to the present embodiment makes a correction for each of the plurality of correction factors, allowing the mask pattern configuration of the photomask 3 to be corrected more precisely. Thus, the semiconductor device can be manufactured with higher dimensional accuracy. Moreover, when a change in process or the like requires a modification of the amount of correction, either amount of the optical proximity correction and pattern-density-induced correction that requires a modification may only be recalculated and modified. This allows an operation for changing process or the like to be simplified.

Further, the method of manufacturing the photomask according to the present embodiment makes a correction based on the correction function using the occupation rate of the mask pattern as a variable. The correction function allows correction to be made better in accordance with the occupation rate R than the correction table.

Furthermore, the method of the present embodiment changes the size by which the photomask 3 is divided into a plurality of regions depending on correction factors. Thus, a correction can be made by an optimum region size that reflects a factor of the pattern-density-induced correction, allowing a semiconductor device to be manufactured with higher dimensional accuracy.

Although the present embodiment has described that the pattern configuration is corrected in the order of the correction for a factor resulting from the etching step of the semiconductor device, the correction for a factor resulting from the etching step of the photomask 3 and the optical proximity correction, the present invention is not limited to this order. However, making the corrections along the process flow may allow the semiconductor device to be manufactured with higher dimensional accuracy.

Fourth Preferred Embodiment

Figure 11:
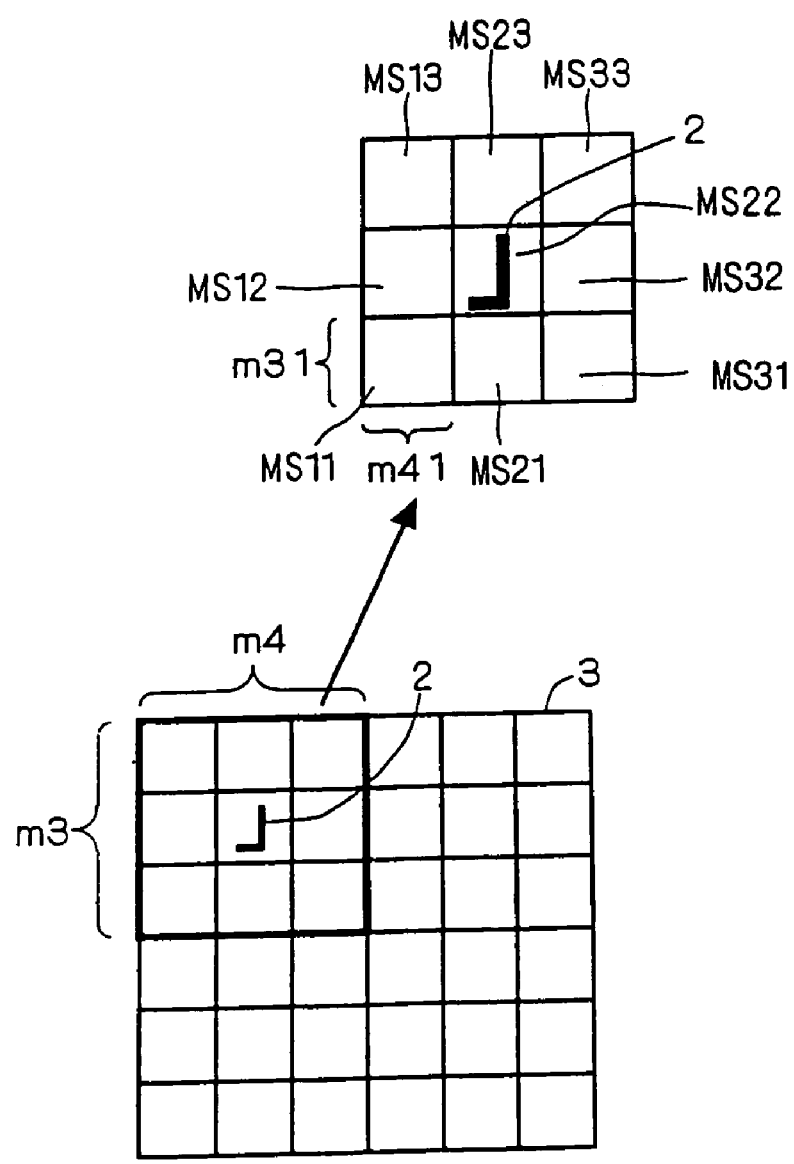
FIG. 11 is a plan view showing a photomask according to a fourth preferred embodiment of the invention.

For a mesh region M described in the third preferred embodiment, an optimum size is selected for each correction factor. Here, an optimum size means a range where the pattern density as a correction factor causes the shift of a transferred pattern from a photomask. In contrast, in the present embodiment the mesh region M is further divided into regions (hereinafter also referred to as sub-mesh regions MS) of size smaller than an optimum size. FIG. 11 illustrates the photomask 3 divided into mesh regions M of an optimum size of m3×m4 (a mesh region M being indicated by a bold line). Further, as shown in FIG. 11, an m3×m4 mesh region M is divided into m31×m41 sub-mesh regions MS.

Next, the occupation rate R of a mask pattern in a sub-mesh region MS is calculated. In the present embodiment, the occupation rate R in each sub-mesh region MS is not merely calculated, but the average of occupation rates R in sub-mesh regions MS adjacent to a sub-mesh region MS, which is a target of calculation, is obtained as the occupation rate R of the target sub-mesh region MS. A sub-mesh region MS22 having a gate interconnect 2 will be specifically described in reference to FIG. 11. The occupation rate R in the sub-mesh region MS22 is the average of the respective occupation rates R in sub-mesh regions MS11, MS12, MS13, MS21, MS23, MS31, MS32 and MS33 adjacent to the sub-mesh region MS22. The occupation rate R in all the sub-mesh regions MS can be determined by the above-described average value. Then, the pattern configuration of the photomask 3 is corrected as described in the first to third preferred embodiments based on the occupation rate R of the sub-mesh regions MS. In one embodiment of the present invention, the average of occupation rates R in mesh regions M adjacent to a mesh region M, which is a target of calculation, may be determined as the occupation rate R of the target mesh region M without dividing the target mesh region M into sub-mesh regions MS.

As described, according to the method of the present embodiment, the occupation rate of a mask pattern in a target region is the average of occupation rates of the mask pattern in regions adjacent to the target region. Thus, the pattern configuration of the photomask 3 can be corrected reflecting the pattern configuration in regions adjacent to the target region better, allowing the semiconductor device to be manufactured with higher dimensional accuracy.

The photomask manufactured by the method according to any of the first to forth preferred embodiments is used for the manufacture of a semiconductor device. Particularly, the photomask is used in an exposing step in the manufacture of the semiconductor device. Since the photomask influences the accuracy of the gate width L of the semiconductor device and the like, the photomask manufactured by the method described in any of the first to fourth preferred embodiments has the following effects.

The photomask manufactured by the method described in any of the first to fourth preferred embodiments makes the optical proximity correction and pattern-density-induced correction, allowing the semiconductor device to be manufactured with higher dimensional accuracy.

Further, in the method of manufacturing a semiconductor device having an exposing step using the above-described photomask, the photomask is subjected to the optical proximity correction and pattern-density-induced correction, allowing the semiconductor device to be manufactured with higher dimensional accuracy.

Furthermore, the photomask subjected to the optical proximity correction and pattern-density-induced correction is used to manufacture the semiconductor device through the above-described method, allowing the semiconductor device to be manufactured with higher dimensional accuracy.

While the invention has been shown and described in detail, the foregoing description is in all aspects illustrative and not restrictive. It is therefore understood that numerous modifications and variations can be devised without departing from the scope of the invention.

What is claimed is:

1. A method of correcting a photomask comprising:
  (a) calculating a first correction for correcting a configuration of a mask pattern of said photomask in accordance with:
    a space between said mask pattern and an adjacent mask pattern thereto, and
    a desired configuration to be transferred from said mask pattern;
  (b) dividing said photomask into a plurality of regions;
  (c) calculating a second correction of said configuration of said mask pattern of said photomask in accordance with an occupation rate of said mask pattern in each of said plurality of regions, said first correction having an effect in a smaller range than said second correction; and
  (d) correcting said photomask based on said first correction and said second correction.

2. The method according to claim 1, wherein said first and second corrections are made independently.

3. The method according to claim 1, wherein said second correction is made based on a correction table generated in accordance with said occupation rate of said mask pattern.

4. The method according to claim 1, wherein said second correction is made based on a correction function using said occupation rate of said mask pattern as a variable.

5. The method according to claim 1, wherein in said second correction, a size by which said photomask is divided into said plurality of regions is selected for each correction factor.

6. The method according to claim 5, wherein said correction factor includes a plurality of correction factors, and
said second correction performs a correction for each of said plurality of correction factors.

7. A method of correcting a photomask comprising:
  (a) calculating a first correction for correcting a configuration of a mask pattern of said photomask in accordance with:
    a space between said mask pattern and an adjacent mask pattern thereto, and
    a desired configuration to be transferred from said mask pattern;
  (b) dividing said photomask into a plurality of regions;
  (c) calculating a second correction of said configuration of said mask pattern of said photomask in accordance with an occupation rate of said mask pattern in each of said plurality of regions, wherein said occupation rate in an arbitrary region is the average of occupation rates of said mask pattern in regions adjacent to said arbitrary region, said first correction having an effect in a smaller range than said second correction; and
  (d) correcting said photomask based on said first correction and said second correction.

8. The method according to claim 7, wherein said first and second corrections are made independently.

9. The method according to claim 7, wherein said second correction is made based on a correction table generated in accordance with said occupation rate of said mask pattern.

10. The method according to claim 7, wherein said second correction is made based on a correction function using said occupation rate of said mask pattern as a variable.

11. The method according to claim 7, wherein in said second correction, a size by which said photomask is divided into said plurality of regions is selected for each correction factor.

12. The method according to claim 11, wherein said correction factor includes a plurality of correction factors, and
said second correction performs a correction for each of said plurality of correction factors.

13. A method of correcting a photomask comprising:
  (a) calculating a first correction for correcting a configuration of a mask pattern of said photomask in accordance with:
    a space between said mask pattern and an adjacent mask pattern thereto, and
    a desired configuration to be transferred from said mask pattern;
  (b) dividing said photomask into a plurality of regions; and
  (c) calculating a second correction of said configuration of said mask pattern of said photomask in accordance with an occupation rate of said mask pattern in each of said plurality of regions, wherein when an arbitrary mask pattern occupies more than one region of said plurality of regions, said second correction of each region occupied by said arbitrary mask pattern is the average of second corrections of all regions occupied by said arbitrary mask pattern, said first correction having an effect in a smaller range than said second correction; and
  (d) correcting said photomask based on said first correction and said second correction.

14. The method according to claim 13, wherein said first and second corrections are made independently.

15. The method according to claim 13, wherein said second correction is made based on a correction table generated in accordance with said occupation rate of said mask pattern.

16. The method according to claim 13, wherein said second correction is made based on a correction function using said occupation rate of said mask pattern as a variable.

17. The method according to claim 13, wherein in said second correction, a size by which said photomask is divided into said plurality of regions is selected for each correction factor.

18. The method according to claim 17, wherein said correction factor includes a plurality of correction factors, and
said second correction performs a correction for each of said plurality of correction factors.

* * * * *